(12) United States Patent
Hatori et al.

(10) Patent No.: US 7,738,523 B2
(45) Date of Patent: Jun. 15, 2010

(54) OPTICAL SEMICONDUCTOR DEVICE HAVING DIFFRACTION GRATING

(75) Inventors: Nobuaki Hatori, Kanagawa (JP); Tsuyoshi Yamamoto, Kawasaki (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 0 days.

(21) Appl. No.: 11/716,017

(22) Filed: Mar. 9, 2007

(65) Prior Publication Data
US 2007/0248134 A1 Oct. 25, 2007

(30) Foreign Application Priority Data
Mar. 10, 2006 (JP) ............... 2006-065791

(51) Int. Cl.
*H01S 5/00* (2006.01)
(52) U.S. Cl. .................................. 372/45.01
(58) Field of Classification Search .............. 372/45, 372/46, 45.01
See application file for complete search history.

(56) References Cited

U.S. PATENT DOCUMENTS

| 4,783,788 A | 11/1988 | Gordon | 372/45 |
| 2002/0141467 A1* | 10/2002 | Iwai et al. | 372/45 |
| 2004/0168626 A1* | 9/2004 | Moeck et al. | 117/84 |
| 2005/0271089 A1* | 12/2005 | Robbins et al. | 372/20 |

FOREIGN PATENT DOCUMENTS

| EP | 0 632 299 A2 | 1/1995 |
| EP | 632299 A2 * | 1/1995 |
| EP | 1 283 571 A1 | 2/2003 |
| JP | 2001-133647 | 5/2001 |
| JP | 2003-152273 | 5/2003 |
| WO | WO 2005/060058 A1 | 6/2005 |
| WO | WO 2005/124951 A1 | 12/2005 |

OTHER PUBLICATIONS

S. Oku, et al.; "Fabrication and Performance of AlGaAs-GaAs Distributed Bragg Reflector Lasers and Distributed Feedback Lasers Utilizing First-Order Diffraction Gratings Formed by a Periodic Groove Structure;" *IEEE Journal of Selected Topics in Quantum Electronics*; vol. 5; No. 3; May/Jun. 1999; pp. 682-687 (3 Sheets.)/ Discussed in the specification.
Kamp M et al: "Lateral coupling—a material independent way to complex coupled DFB lasers"; Optical Materials 17 (2001) pp. 19-25.
European Search Report dated Jun. 5, 2007.

* cited by examiner

*Primary Examiner*—Minsun Harvey
*Assistant Examiner*—Patrick Stafford
(74) *Attorney, Agent, or Firm*—Kratz, Quintos & Hanson, LLP

(57) ABSTRACT

An optical semiconductor device includes: a waveguide structure including layers grown over a semiconductor substrate, having a width defined by sidewalls formed by etching the layers, and including a wide, a narrow, and an intermediate width portion, formed along a propagation direction; and a diffraction grating formed on the sidewalls of at least one of the wide and narrow width portions of the waveguide structure, the diffraction grating having vertical grooves periodically disposed along the propagation direction and defining a wavelength of propagation light, wherein the narrow width portion is formed in such a manner that a loss of 50% or more is given to a higher order transverse mode. An optical semiconductor device having a vertical diffraction grating is provided which can suppress generation of a higher order transverse mode and an increase in a device resistance.

19 Claims, 5 Drawing Sheets

Pc(DGn)  Pc(DGi)  Pc(DGw)

WGw    WGi    WGn

OPTICAL SEMICONDUCTOR DEVICE HAVING DIFFRACTION GRATING

CROSS REFERENCE TO RELATED APPLICATION

This application is based on and claims priority of Japanese Patent Application No. 2006-065791 filed on Mar. 10, 2006, the entire contents of which are incorporated herein by reference.

BACKGROUND OF THE INVENTION

A) Field of the Invention

The present invention relates to an optical semiconductor device having a diffraction grating, and more particularly to an optical semiconductor device having a vertical groove diffraction grating.

B) Description of the Related Art

The following methods are known as a method of forming a diffraction grating of a distributed feedback (DFB) laser or a distributed Bragg reflector (DBR) laser: (1) a regrowth method by which a diffraction grating pattern is formed on the surface of a lower growth layer, and an upper crystal growth layer is regrown on the lower growth layer to form a diffraction grating at the interface of the growth layer; and (2) collective etching method by which a diffraction grating is formed by etching vertical grooves periodically disposed along a waveguide direction on the sidewalls of a waveguide structure, etching starting from the surface of epitaxial stack structure. It is necessary for the regrowth method (1) to perform crystal growth twice, which is likely to increase cost. If the surface of the lower growth layer is made of material which contains Al, the regrowth itself may become not easy. For applications requiring low cost, the collective etching method (2) is preferable in many cases.

Oku et al.: IEEE Journal of Selected Topics in Quantum Electronics, Vol. 5, No. 3, p. 682, 1999 reports the characteristics of a DBR laser and a DFB laser formed by etching stacked layers including an InGaAs—GaAs strain quantum well active layer to a depth of 700 nm and 800 nm at a pitch of 150 nm, to form a DBR laser and a DFB laser having an oscillation frequency of 980 nm, as compared to the characteristics of a Fabry-Perot type laser.

It can be said that the collective etching method (2) is a simple manufacture method which can form at the same time both a waveguide structure and a diffraction grating by deeply etching a stacked layer structure. However, if the width of the waveguide is made narrow to some extent, a higher order transverse mode becomes likely to oscillate, forming two or more optical intensity peaks along a waveguide width direction. As the waveguide width is narrowed in order to suppress a higher order transverse mode, a device resistance increases.

JP-A-2003-152273 proposes to suppress a higher order transverse mode by giving a loss by covering a diffraction grating with an absorbing material such as GaAs. This method gives a loss also in the fundamental mode, being likely to raise a threshold value and lower an efficiency.

JP-A-2001-133647 proposes to eliminate a higher order mode by forming a diffraction grating on sidewalls of a waveguide structure at a pitch longer than $\lambda/2$ and shorter than $\lambda$, where $\lambda$ is a waveguide effective wavelength. This diffraction grating has a function different from the diffraction grating of a DFB laser or DBR laser.

SUMMARY OF THE INVENTION

An object of the present invention is to provide an optical semiconductor device capable of suppressing generation of a higher order transverse mode, the optical semiconductor device having a vertical groove diffraction grating on sidewalls of a waveguide.

Another object of the present invention is to provide an optical semiconductor device capable of suppressing generation of a higher order transverse mode and suppressing an increase in a device resistance, the optical semiconductor device having a vertical groove diffraction grating on sidewalls of a waveguide.

According to one aspect of the present invention, there is provided an optical semiconductor device comprising: a semiconductor substrate; a waveguide structure including layers grown over said semiconductor substrate, having a width defined by sidewalls formed by etching the layers, and including a wide width portion, a narrow width portion and an intermediate width portion connecting said wide width portion and said narrow width portion, formed along a propagation direction; and a diffraction grating formed on the sidewalls of at least one of said wide width portion and said narrow width portion of said waveguide structure, said diffraction grating having vertical grooves periodically disposed along the propagation direction and defining a wavelength of propagation light, wherein said narrow width portion is formed in such a manner that a loss of 50% or more is given to a higher order transverse mode.

The narrow width portion suppresses the higher order transverse mode and the wide width portion suppresses an increase in a device resistance.

DESCRIPTION OF THE PREFERRED EMBODIMENTS

Figure 1A:
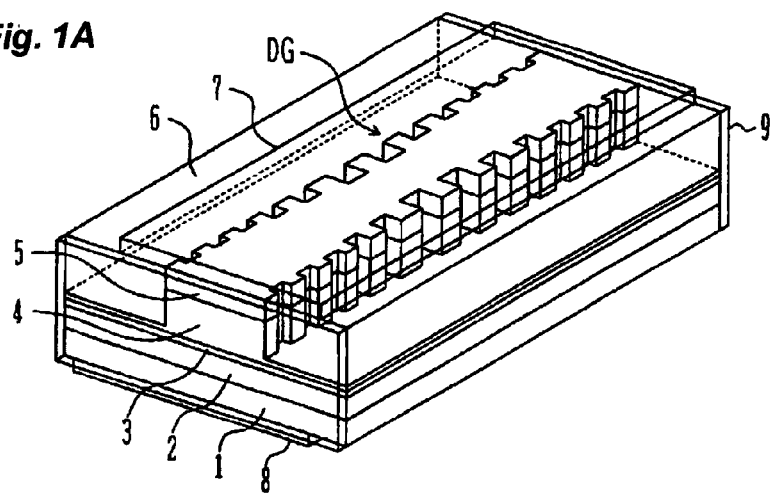
FIGS. 1A to 1E are a perspective view, a cross sectional view and plan views of a ridge type semiconductor laser according to a first embodiment of the present invention.

FIG. 1A shows a ridge type laser according to the first embodiment of the present invention. Formed on an n-type (001) GaAs substrate 1 by molecular beam epitaxy (MBE) are: an n-type $Al_{0.4}Ga_{0.6}As$ clad layer 2 having a thickness of 1.4 µm; an active layer 3 including multiple quantum dot layers; a p-type $Al_{0.4}Ga_{0.6}As$ clad layer 4 having a thickness of 1.4 µm; and a p-type GaAs contact layer 5 having a thickness of 0.4 µm.

Figure 1B:
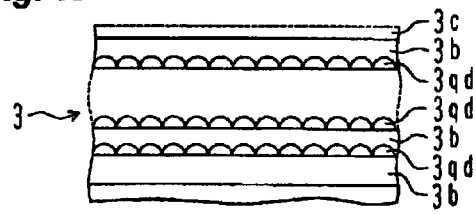

As shown in FIG. 1B, the active layer 3 having ten quantum dot layers is formed by the following processes. After a GaAs barrier layer 3b having a thickness of, e.g., 36 nm is grown, InAs having a large lattice mismatch is grown in molecular layer order to form an InAs quantum dot layer 3qd by a self formation method in Stranski-Krastanov growth mode (S-K mode) which forms quantum dots at a thickness larger than a critical thickness. This InAs quantum dot layer is covered with a GaAs barrier layer 3b having a thickness of 36 nm. Further, pairs of similar InAs quantum dot layer 3qd and GaAs barrier layer 3b having the thickness of 36 nm are grown nine times. For formation of a quantum dot layer, for example, refer to paragraphs [0013] to [0070] of publicated Japanese Patent No. 3672678 (corresponding U.S. Pat. No. 3,672,527 which is incorporated herein by reference). An InGaAs cap layer 3c may be formed on the GaAs barrier layer 3b to adjust an oscillation wavelength.

Reverting to FIG. 1A, a silicon oxide layer having a thickness of, e.g., 300 nm is formed on the semiconductor layers structure by chemical vapor deposition (CVD) or the like, and an electron beam resist film is coated on the silicon oxide layer. A pattern of a ridge waveguide and a diffraction grating is exposed in the electron beam resist film, and is developed to form the electron beam resist pattern. The resist pattern is transferred to the silicon oxide layer to form a hard mask. A propagation direction of the waveguide is called a length, and the transverse direction is called a width.

Figure 1C:
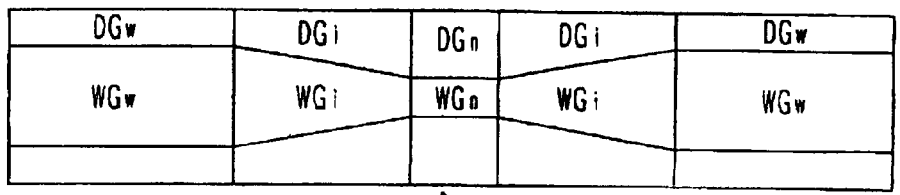

As shown in FIG. 1C, a mask pattern MP has a diffraction grating portion DG on both sides of a ridge waveguide portion WG, and has, for example, a total width of 6 μm and a total effective length of 500 μm. The waveguide portion WG has: a wide width portion WGw at opposite ends having a width of 4 μm and a length of 125 μm; a narrow width portion WGn in a central area having a width of 1.5 μm and a length of 50 μm; and a tapered intermediate portion WGi between the wide width portion and narrow width portion having a length of 100 μm and gradually changing the waveguide width in a range from the narrow width to the wide width. The waveguide width of the intermediate portion WGi changes gradually and linearly from the waveguide width of the narrow width portion WGn to the waveguide width of the wide width portion WGw. The diffraction grating DG is constituted of wide width portions DGw, a narrow width portion DGn and intermediate (width) portions DGi along the length direction in correspondence with the structure of the waveguide portions, and has widths of the total width of 6 μm subtracted by the waveguide widths.

Figure 1D:
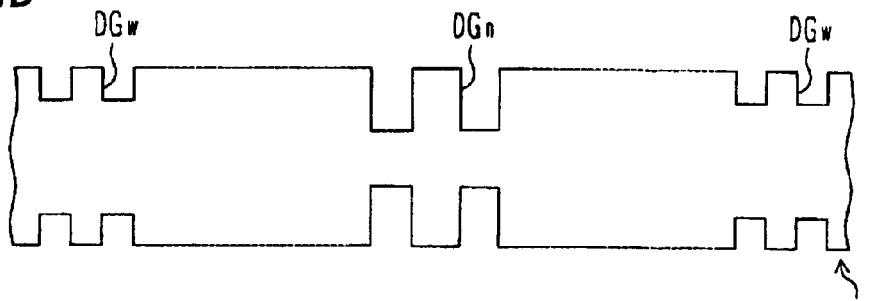

FIG. 1D shows a schematic structure of the diffraction grating portion DG. When the waveguide width changes, an effective refractive index changes also. A change occurs, therefore, in a period of the diffraction grating for selectively reflecting light of a target wavelength. A pitch of the diffraction grating DGw in the wide width portion is set to 192.6 nm, and a pitch of the diffraction grating DGn in the narrow width portion is set to 193.1 nm. In the intermediate portion DGi where the waveguide width changes gradually, a pitch of the diffraction grating is changed between 192.6 nm and 193.1 nm, for example, linearly. Although the pitch of the diffraction grating changes, a selected wavelength is the same at about 1.28 μm when the effective refractive index is taken into consideration.

A length of a tooth portion of the diffraction grating (a length of the diffraction grating) along the waveguide width direction is equal to the width of the diffraction grating portion DG. The tooth portion length is 1 μm in the wide width portion DGw, and 2.25μ in the narrow width portion DGn. As the diffraction grating length of the narrow width portion is elongated, it becomes possible to enhance selectivity of the fundamental transverse mode in the narrow width portion.

Reverting to FIG. 1A, by using the hard mask MP as an etching mask, the semiconductor layers layer is anisotropically etched from the surface thereof by mixture gas of ($Br_2$+ $N_2$) or the like, to a depth partially leaving a thickness of the p-type clad layer 4 or to a depth exposing the uppermost barrier layer 3b. In this manner, a ridge type waveguide structure is formed having the vertical groove diffraction gratings on the sidewalls. The ridge type waveguide is buried in an insulator 6 such as ultraviolet ray curing resin, the insulator being transparent relative to a target wavelength. Current injection electrodes 7 and 8 are formed on the top and bottom surfaces of the waveguide structure. Opposite ends of the waveguide structure are cleaved to form a cavity. If necessary, a reflection film or films 9 made of dielectric multilayer and having a desired reflectivity is/are formed on an end surface or end surfaces.

Figure 1E:
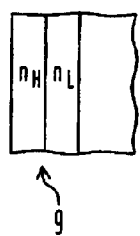

FIG. 1E shows an example of the reflection film 9. A silicon oxide film as a low refractive index film $n_L$ and a silicon film as a high refractive index film $n_H$ are alternately stacked to realize a desired reflectivity. For example, one pair of a stacked low refractive index film and high refractive index film realizes a reflectivity of 80%, and two pairs of a stacked low refractive index film and high refractive index film realize a reflectivity of 93 to 95%. An antireflection film may be formed by a single low refractive index film or multilayer of low refractive index film and high refractive index film. In the structure shown in FIG. 1A, an antireflection film is formed. For a semiconductor laser manufacture method, a well-known method may be used, as disclosed, for example, in Oku et al.: IEEE Journal of Selected Topics in Quantum Electronics, Vol. 5, No. 3, p. 682, 1999, which is incorporated herein by reference.

It has been found from calculations that in the embodiment structure, a loss is not generated in the fundamental transverse mode, although a loss of about 50% is generated in the higher first order transverse mode. It can be understood that the higher order transverse mode is suppressed. As compared to a waveguide structure whose waveguide width is set to 1.5 μm over the whole device length, an ohmic contact area on the top surface of the device is increased about twice, and an increase in a device resistance can be suppressed.

The size of each portion of the device described above is only illustrative, and can have various different sizes. For example, if the waveguide width of the narrow width portion WGn is 0.8 μm, although a loss is generated in the fundamental transverse mode, a loss of about 93% is generated in the higher first order transverse mode. The higher first order transverse mode is suppressed considerably. In this case, as compared to a waveguide structure whose waveguide width is set to 0.8 μm over the whole device length, an ohmic contact area on the top surface of the device is increased about 3.8 times, and an increase in a device resistance can be suppressed.

If the length of the wide width portion WGw is changed to 50 μm and the length of the narrow width portion WGn is changed to 200 μm, a loss is not generated in the fundamental transverse mode and a loss of about 70% is generated in the higher first order transverse mode. The higher order transverse mode can be suppressed effectively. As compared to a waveguide structure whose waveguide width is set to 1.5 μm over the whole device length, an ohmic contact area on the top surface of the device is increased about 1.6 times, and an increase in a device resistance can be suppressed. In this manner, by generating a loss of 50% or more in the higher order transverse mode, it becomes possible to suppress the higher order transverse mode and efficiently extract the fundamental transverse mode. In the following, modifications of the first embodiment will be described.

Figure 2A:
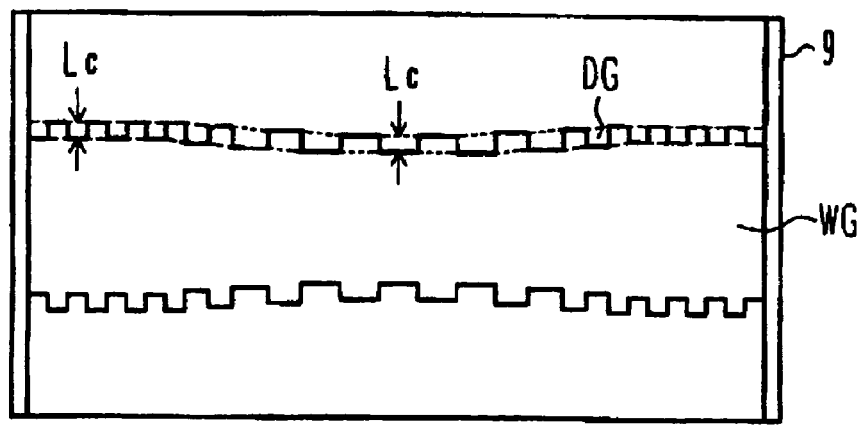
FIGS. 2A to 2J are plan views showing modifications of the first embodiment.

FIG. 2A shows the structure that a tooth length of the diffraction grating along the waveguide width direction is made constant over the whole device length. The tooth length of diffraction grating from the wide width portion DGw toward the narrow width portion DGn has a constant value Lc. Although the suppression effect of the higher order transverse mode reduces and a threshold gain in the fundamental transverse mode rises slightly, there exist considerable higher order transverse mode suppression effect and the device resistance increase suppression effect.

Figure 2B:
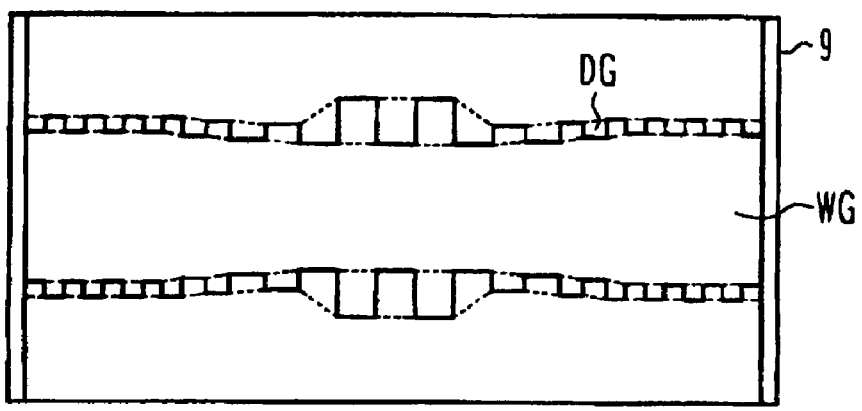

FIG. 2B shows the structure that a width of the whole ridge structure including the waveguide structure and diffraction grating structure is changed along the device length direction. It is not necessary to set the whole ridge structure width constant. In this structure, although the width of the whole ridge structure is made wider in the narrow width portion, the width may be made narrower in the narrow width portion.

Figure 2C:
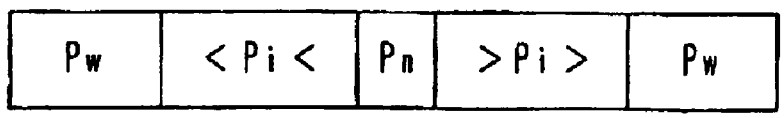

FIG. 2C is a schematic diagram showing the structure that a pitch of the diffraction grating in the intermediate portion DGi is set to a constant pitch Pi which takes an intermediate value between a pitch Pn of the diffraction grating in the narrow width portion and a pitch Pw of the diffraction grating in the wide width portion. In this case, the mask forming process can be simplified.

Figure 2D:

FIG. 2D is a schematic diagram showing the structure that a pitch of the diffraction grating in the intermediate portion DGi is set stepwise to Pi1, Pi2 and Pi3 between a pitch Pn of the diffraction grating in the narrow width portion and a pitch Pw of the diffraction grating in the wide width portion.

Figure 2E:
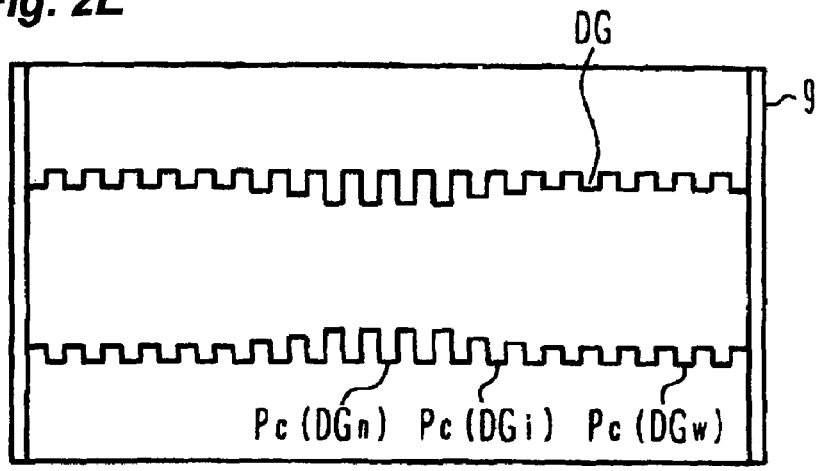

FIG. 2E shows the structure that a pitch of the diffraction grating is set to a constant value Pc in the narrow width portion DGn, intermediate portions DGn and wide width portions DGw. Although the wavelength selectivity lowers slightly, there exist the higher order transverse mode suppression effect and the device resistance increase suppression effect.

Figure 2F:
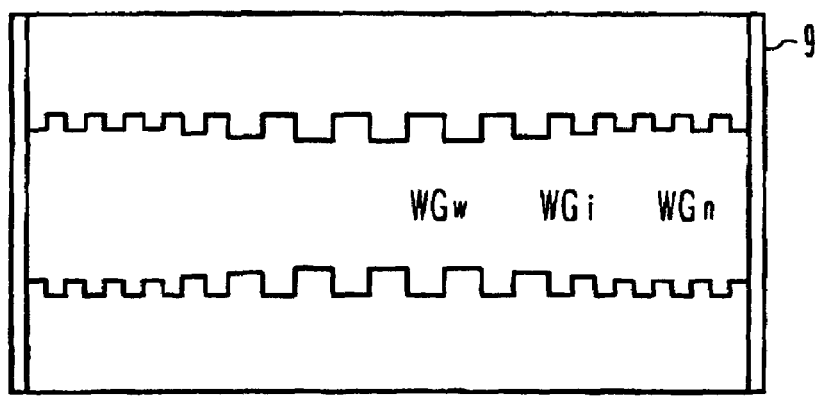

FIG. 2F shows the structure that the waveguide width of the intermediate portion WGi is not changed continuously but set to an intermediate width between the waveguide width of the wide width portion WGw and the waveguide width of the narrow width portion WGn. The waveguide width of the intermediate portion may be changed stepwise. Although the wavelength selectivity lowers slightly, a loss increases at connection portions, there exist the higher order transverse mode suppression effect and the device resistance increase suppression effect.

Figure 2G:
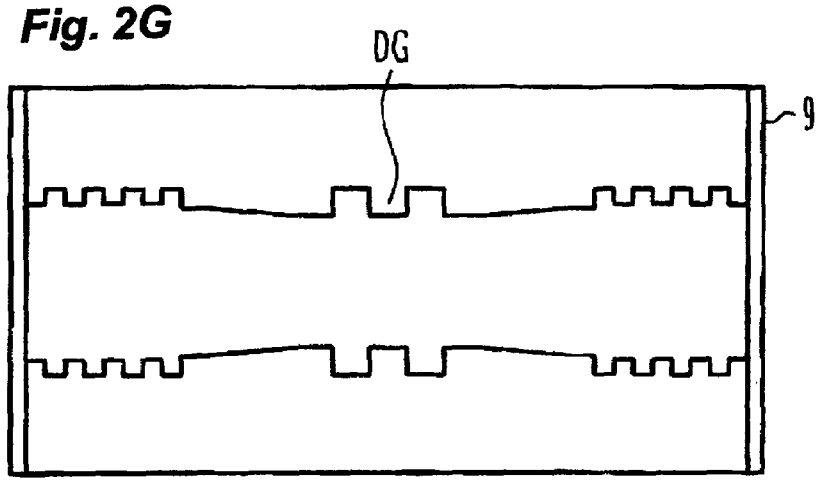

FIG. 2G shows the structure that the diffraction grating is not formed in the intermediate portion WGi. Although the wavelength selectivity lowers, there exist the higher order transverse mode suppression effect and the device resistance increase suppression effect.

Figure 2H:
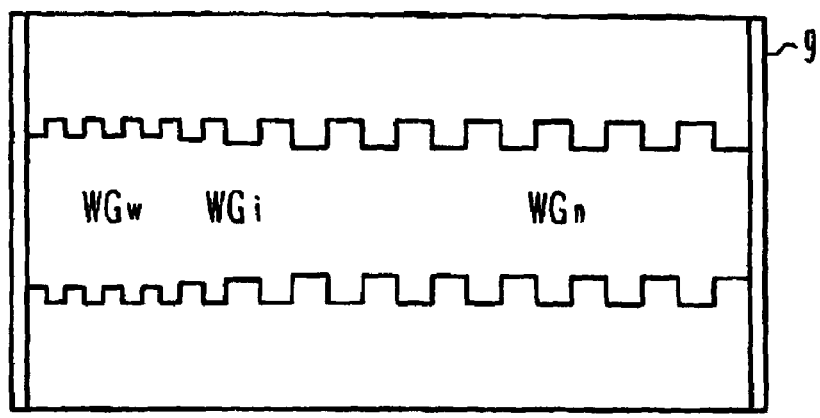

FIG. 2H shows the structure that a wide width portion WGw is formed at one end of the waveguide, a narrow width portion WGn is formed at the other end, and an intermediate portion WGi connects these two portions. Although at least one narrow width portion and at least one wide width portion are necessary, the layout of these portions may be changed in various ways.

Figure 2I:
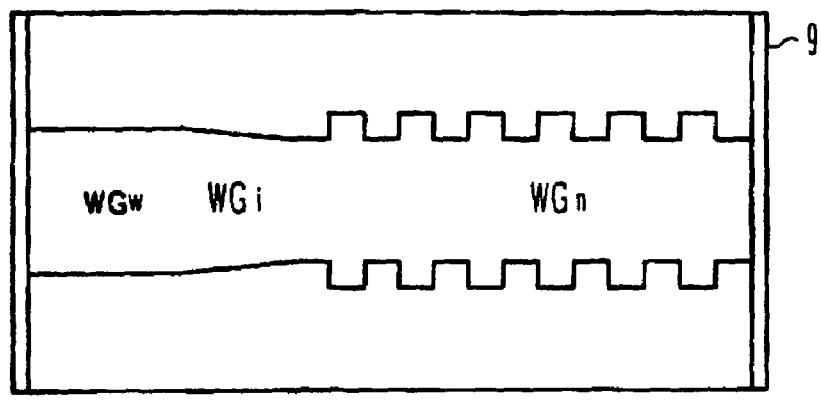

FIG. 2I shows the structure that the diffraction grating is not formed in the wide width portion WGw and intermediate portion WGi, being modified from the structure shown in FIG. 2H. Instead of forming the diffraction grating only in the narrow width portion WGn, the diffraction grating may be formed only in the wide width portion WGw. An antireflection film is not formed at the end where the diffraction grating is not formed. A high reflection film may be used. If a DFB laser is to be formed, it is necessary to form the diffraction grating on the end surface side where the antireflection film 9 is formed.

Figure 2J:
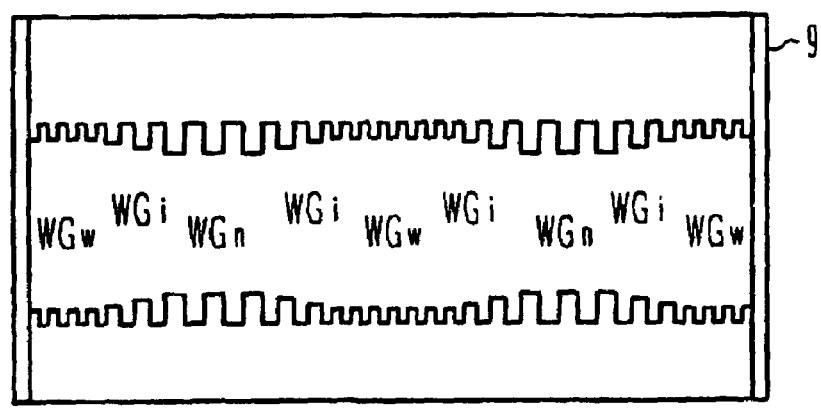

FIG. 2J shows the structure that a plurality of narrow width portions WGn are formed in the total device length. The number of narrow width portions can be increased depending upon a resonator length. It is, however, preferable to set the waveguide width of the narrow width portion to 75% of or narrower than the waveguide width of the wide width portion.

The modifications described above may be combined in various ways if a combination is adequate.

Figure 3:
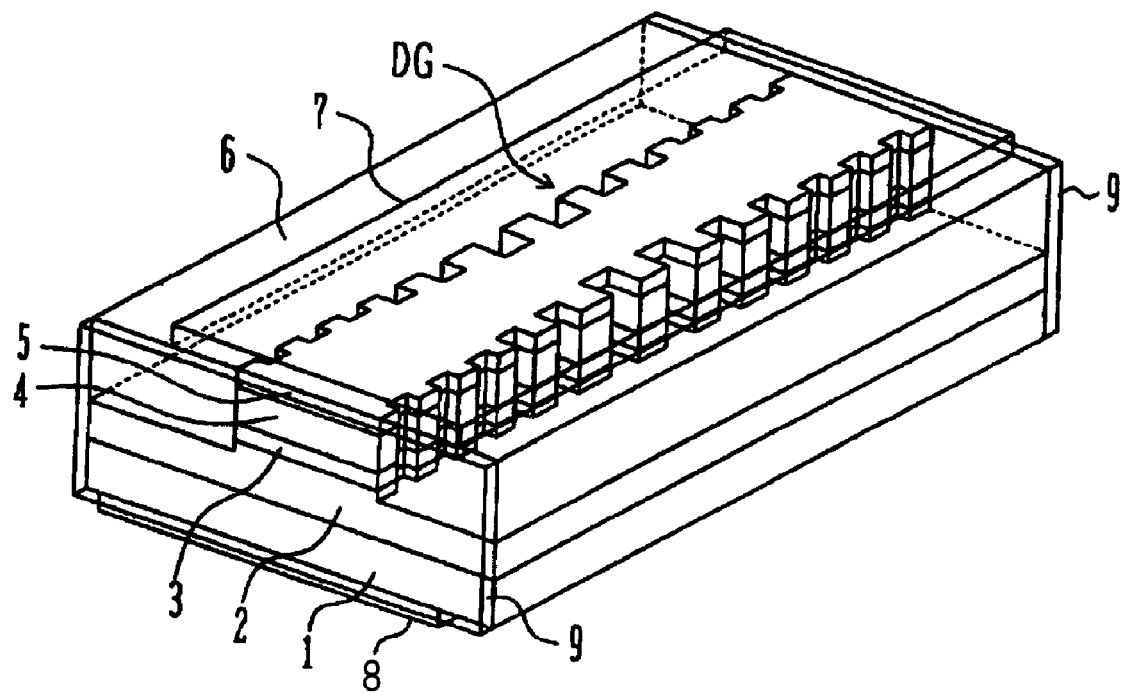
FIG. 3 is a perspective view of a high mesa type semiconductor laser according to a second embodiment of the present invention.

FIG. 3 shows a structure of a DFB semiconductor laser of a high mesa structure according to the second embodiment of the present invention. Similar to the first embodiment, formed on an n-type (001) GaAs substrate 1 by molecular beam epitaxy (MBE) are: an n-type $Al_{0.4}Ga_{0.6}As$ clad layer 2 having a thickness of 1.4 μm; an active layer 3 including multiple quantum dot layers; a p-type $Al_{0.4}Ga_{0.6}As$ clad layer 4 having a thickness of 1.4 μm; and a p-type GaAs contact layer 5 having a thickness of 0.4 μm.

A silicon oxide layer having a thickness of, e.g., 300 nm is formed on the semiconductor layers structure by chemical vapor deposition (CVD) or the like, and an electron beam resist film is coated on the silicon oxide layer. A pattern of a ridge waveguide and a diffraction grating is exposed in the electron beam resist film, and is developed to form the electron beam resist pattern. The resist pattern is transferred to the silicon oxide layer to form a hard mask.

By using the hard mask as an etching mask, the semiconductor layers are etched from the surface thereof through the p-type contact layer 5, p-type clad layer 4 and active layer 3, to an intermediate depth of the n-type clad layer 2. In this manner, a high mesa type waveguide structure is formed having the vertical groove diffraction gratings on the sidewalls. The high mesa type waveguide is buried in an insulator 6 such as ultraviolet ray curing resin, the insulator being transparent relative to a target wavelength. Current injection electrodes 7 and 8 are formed on the top and bottom surfaces of the waveguide structure. Opposite ends of the waveguide structure are cleaved to form a cavity. If necessary, a reflection film or films 9 having desired reflectivity is/are formed on an end surface or end surfaces. A semiconductor laser of the high mesa structure can be formed in the manner described above. Also in this embodiment, modifications such as shown in FIGS. 2A to 2J are possible.

Figure 4:
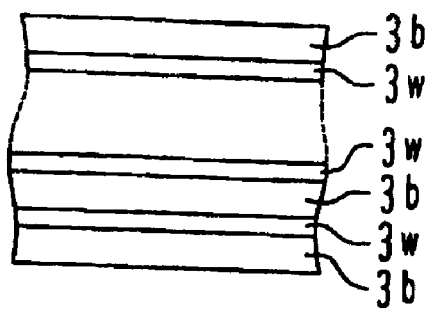
FIG. 4 is a cross sectional view showing a modification of an active layer.

FIG. 4 shows a modification of the active layer 3. A barrier layer 3b and a well layer 3w are alternately stacked, the both end layers being the barrier layer 3b. An active layer of multilayer quantum well structure is therefore formed.

The present invention has been described in connection with the preferred embodiments. The invention is not limited only to the above embodiments. For example, although GaAs/AlGaAs/InAs based materials are stacked on the GaAs substrate, InP/GaInAsP based materials or AlGaInAs based materials may be stacked on an InP substrate. Quantum dots may be made of InAsSb or the like. Instead of a quantum dot active layer, a quantum well active layer, a quantum wire active layer, or a bulk active layer may also be used. The active layer may be doped. All conductivity types may be reversed. A high resistance substrate may also be used. Instead of an active DFB laser or DRB laser having the totally active layer over the whole device length, a DBR laser including a passive waveguide may be formed. It will be apparent to those skilled in the art that other various modifications, improvements, combinations, and the like can be made.

What we claim are:

1. An optical semiconductor device comprising:
   a semiconductor substrate;
   a waveguide structure formed over said semiconductor substrate, having a width defined by sidewalls, and including a first wide width portion having a finite first length and a first width, a narrow width portion having a second length and a second width which is smaller than said first width, a second wide width portion having a finite third length and a third width which is wider than said second width a first intermediate width portion connecting said first wide width portion and said narrow width portion and having a width continuously changing from said first width to said second width, and a second intermediate width portion connecting said narrow width portion and said second wide width portion and having a width continuously changing form said second width to said third width, formed along a propagation direction; and a diffraction grating formed on the sidewalls of at least one of said first wide width portion, said narrow width portion, and said second wide width portion of said waveguide structure, said diffraction grating having vertical grooves periodically disposed along the propagation direction and defining a wavelength of propagation light.

2. The optical semiconductor device according to claim 1, wherein a waveguide width of said narrow width portion is 75% of or narrower than a waveguide width of said first wide width portion.

3. The optical semiconductor device according to claim 1, wherein both ends of said waveguide structure are cleaved to form a cavity.

4. The optical semiconductor device according to claim 3, further comprising a reflection film formed on at least one of end surfaces of said cavity.

5. The optical semiconductor device according to claim 1, wherein said diffraction grating is formed on the sidewalls of both said first wide width portion and said narrow width portion of said waveguide structure.

6. The optical semiconductor device according to claim 5, wherein a pitch of said diffraction grating in said narrow width portion is longer than a pitch of said diffraction grating in said first wide width portion.

7. The optical semiconductor device according to claim 6, wherein each pitch of said diffraction grating in said narrow width portion and said diffraction grating in said wide width portion is determined based on an equivalent refractive index of said waveguide structure and defines a same propagation wavelength.

8. The optical semiconductor device according to claim 5, wherein a lattice length of said diffraction grating in said narrow width portion along a waveguide width direction is longer than a lattice length of said diffraction grating in said first wide width portion along the waveguide width direction.

9. The optical semiconductor device according to claim 5, wherein said diffraction grating is formed also on the sidewalls of the intermediate width portion of said waveguide structure, and a pitch of said diffraction grating in said intermediate width portion is set to a value in a range from a pitch of said diffraction grating in said first wide width portion to a pitch of said diffraction grating in said narrow width portion.

10. The optical semiconductor device according to claim 9, wherein a lattice length of said diffraction grating in said narrow width portion along a waveguide width direction is longer than a lattice length of said diffraction grating in said first wide width portion along the waveguide width direction, and a lattice length of said diffraction grating in said intermediate width portion along the waveguide width direction gradually elongates from said first wide width portion toward said narrow width portion.

11. The optical semiconductor device according to claim 1, wherein said waveguide structure constitutes a ridge waveguide.

12. The optical semiconductor device according to claim 11, wherein said layers includes a lower clad layer, an active layer and an upper clad layer, and said waveguide structure is formed by etching said layers down to a surface of said upper clad layer.

13. The optical semiconductor device according to claim 1, wherein said waveguide structure constitutes a high mesa waveguide.

14. The optical semiconductor device according to claim 13, wherein said layers includes a lower clad layer, an active layer and an upper clad layer, and said waveguide structure is formed by etching said layers through said upper clad layer and said active layer.

15. The optical semiconductor device according to claim 12, wherein said semiconductor substrate is a GaAs substrate.

16. The optical semiconductor device according to claim 15, wherein said active layer contains InAs quantum dots.

17. The optical semiconductor device according to claim 12, wherein said semiconductor substrate is an InP substrate.

18. The optical semiconductor device according to claim 17, wherein said active layer contains InAsSb quantum dots.

19. The optical semiconductor device according to claim 1, wherein said first width and said third width are substantially equal.

* * * * *